United States Patent [19]
Rinke et al.

[11] Patent Number: 5,934,195
[45] Date of Patent: Aug. 10, 1999

[54] APPARATUS FOR AND METHOD OF EXPOSING LITHOGRAPHIC PLATES

[75] Inventors: Ronald A. Rinke, Ozark; Richard P. Simonian, Springfield; John W. Powers, Battlefield, all of Mo.

[73] Assignee: Western Litho Plate & Supply Co., St. Louis, Mo.

[21] Appl. No.: 08/876,617

[22] Filed: Jun. 13, 1997

Related U.S. Application Data

[60] Provisional application No. 60/048,674, Jun. 5, 1997.

[51] Int. Cl.⁶ .................................................. G03F 7/20
[52] U.S. Cl. ...................... 101/401.1; 347/257; 347/242; 347/262
[58] Field of Search .................................. 101/463.1, 465, 101/467, 477, 401.1; 347/257, 262, 264, 242; 355/53, 70, 85, 99

[56] References Cited

U.S. PATENT DOCUMENTS

| | | | |
|---|---|---|---|
| 4,149,798 | 4/1979 | McGowan et al. | 355/133 |
| 4,240,119 | 12/1980 | Norton et al. | 358/297 |
| 4,312,590 | 1/1982 | Harbaugh | 355/51 |
| 4,423,955 | 1/1984 | Powers | 355/99 |
| 5,174,205 | 12/1992 | Kline et al. | 101/136 |
| 5,255,607 | 10/1993 | Nishiyama et al. | 101/463.1 |
| 5,341,157 | 8/1994 | Campagna et al. | 347/264 |
| 5,345,870 | 9/1994 | Bailey et al. | 101/463.1 |
| 5,351,617 | 10/1994 | Williams et al. | 101/467 |
| 5,353,705 | 10/1994 | Lewis et al. | 101/453 |
| 5,369,468 | 11/1994 | Powers et al. | 355/99 |
| 5,434,646 | 7/1995 | Talts | 355/53 |
| 5,459,505 | 10/1995 | Ballegaard et al. | 342/260 |
| 5,550,574 | 8/1996 | Dillow | 347/262 |

FOREIGN PATENT DOCUMENTS

| | | |
|---|---|---|
| 882.781 | 7/1980 | Belgium . |
| 762 723 A2 | 3/1997 | European Pat. Off. . |

*Primary Examiner*—Stephen R. Funk
*Attorney, Agent, or Firm*—Senniger, Powers, Leavitt & Roedel

[57] ABSTRACT

A conveyor conveys first and second plates to an exposure station. First and second laser imagers mounted at the exposure station above the support generate first and second laser beams adapted to sweep over the first and second plates, respectively. A mechanism effects simultaneous relative movement between the first laser imager and the first plate and between the second laser imager and the second plate. A computer system receives source image data corresponding to first and second source images, which correspond to first and second print images to be formed on the first and second plates, respectively. The computer system generates a first set of electrical signals corresponding to the first source image which are provided to the first laser imager, and generates a second set of electrical signals corresponding to the second source image which are provided to the second laser imager. The laser imagers are responsive to the electrical signals to modulate the first and second laser beams in synchronization with the relative movement between the laser imagers and the plates. As a result, the first laser beam is adapted to expose certain portions of the first plate to the first beam to form the first print image on the first plate and the second laser beam is adapted to expose certain portions of the second plate to the second beam to form the second print image on the second plate.

16 Claims, 11 Drawing Sheets

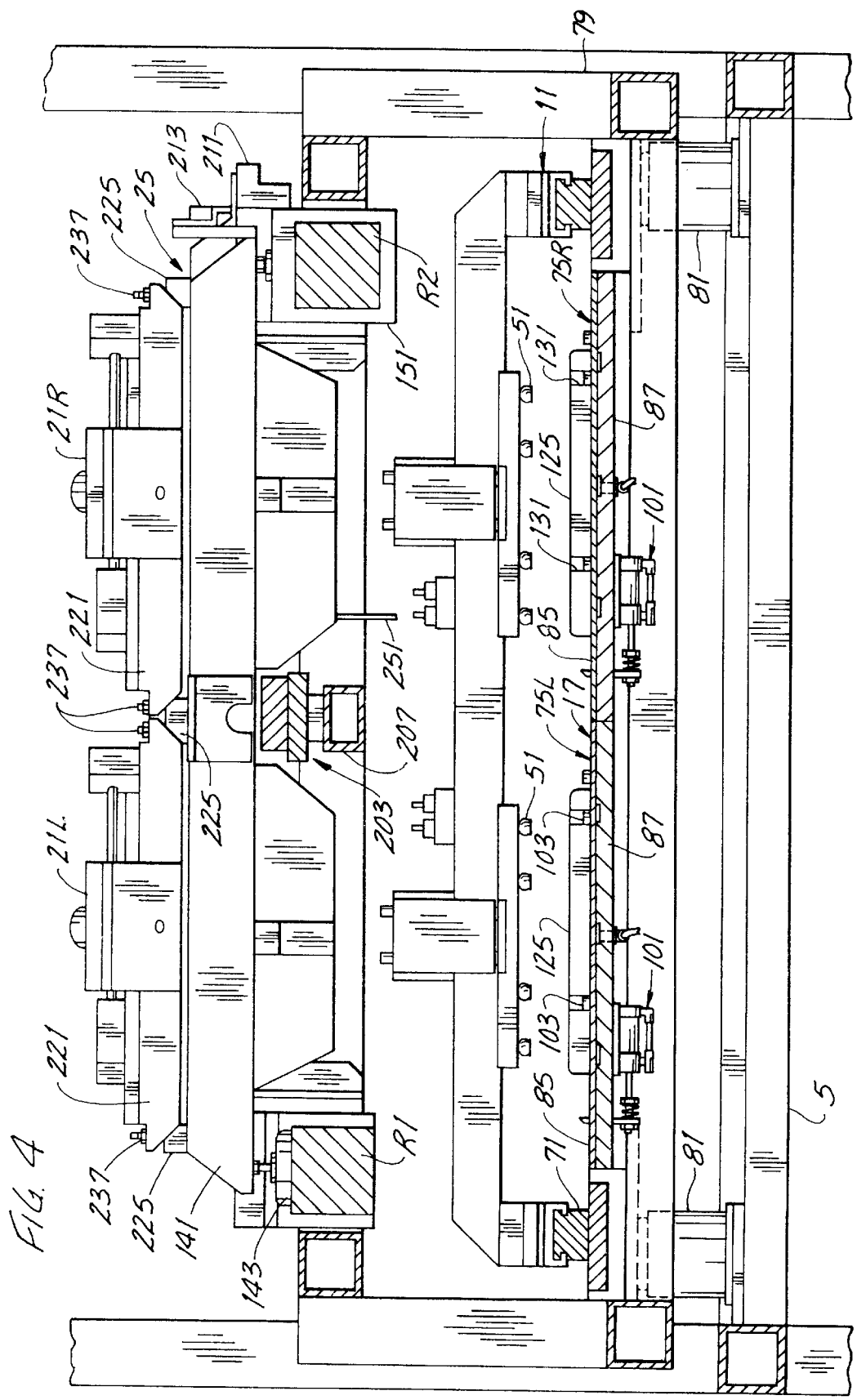

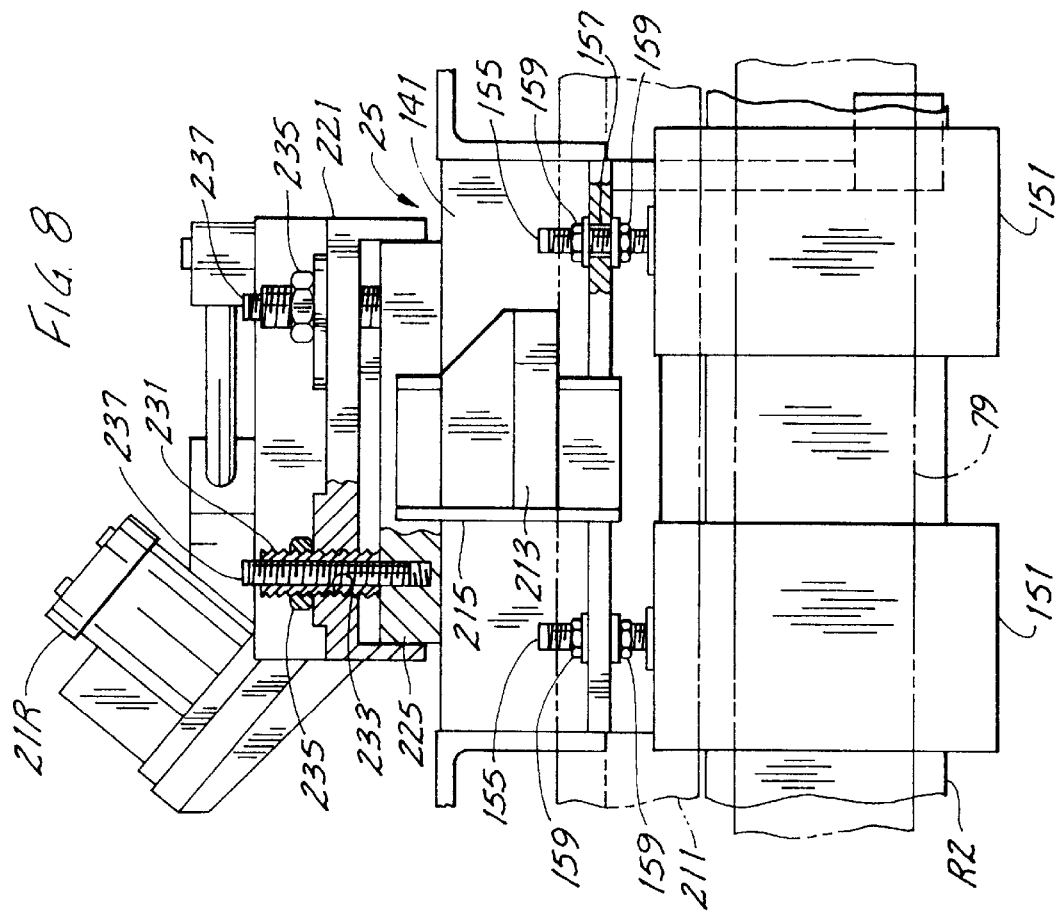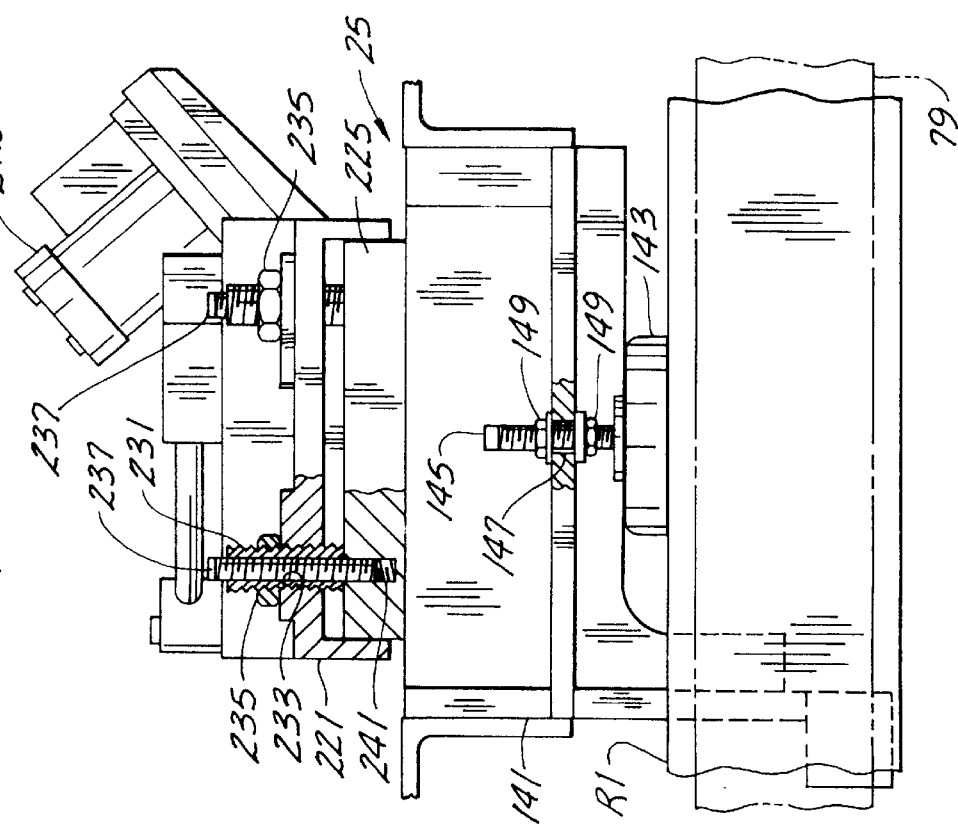

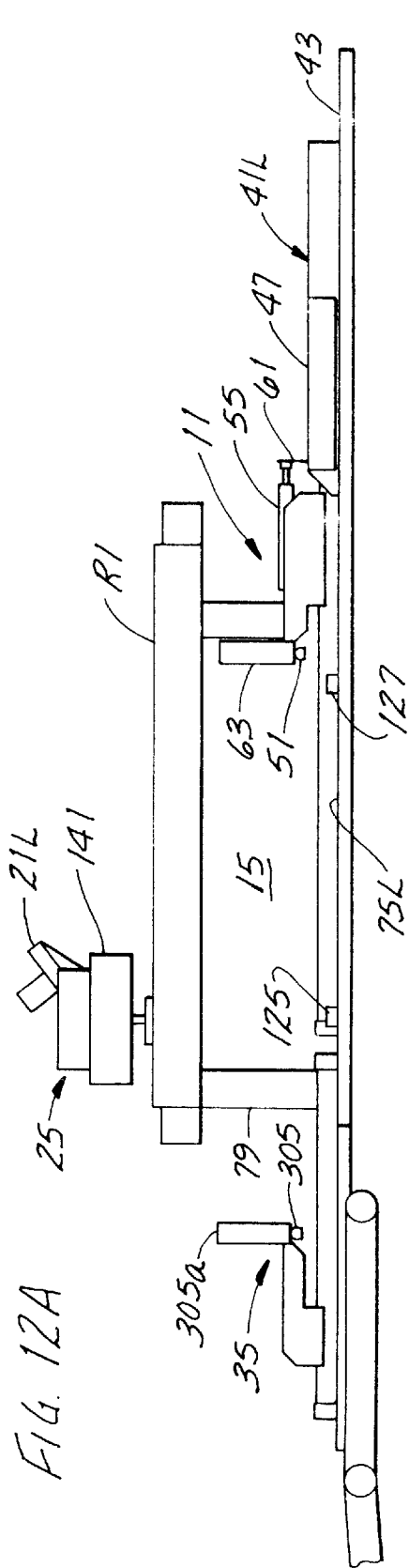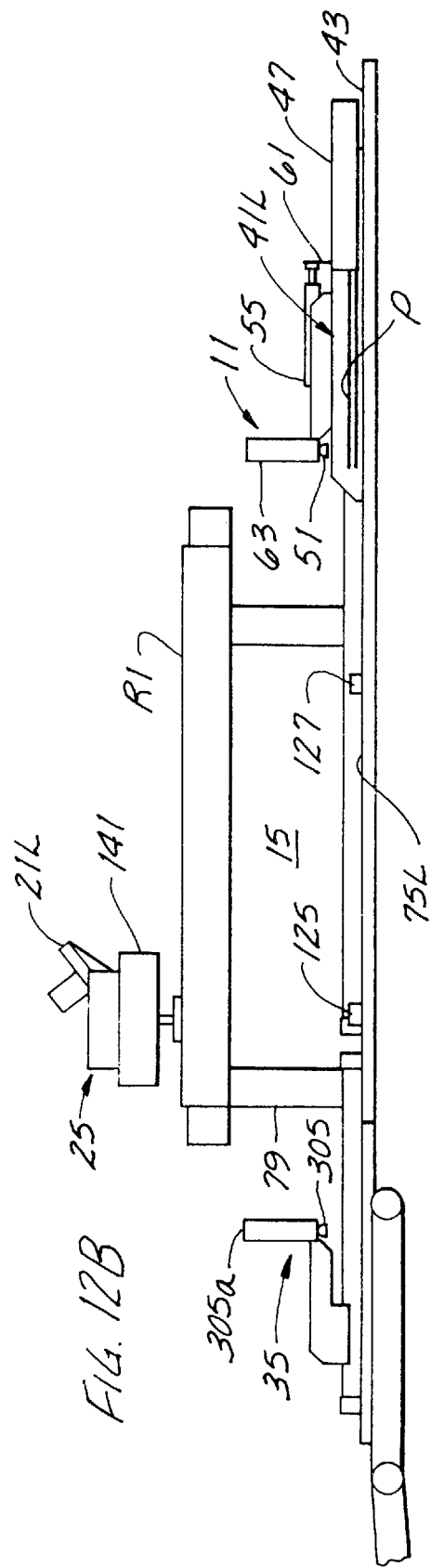

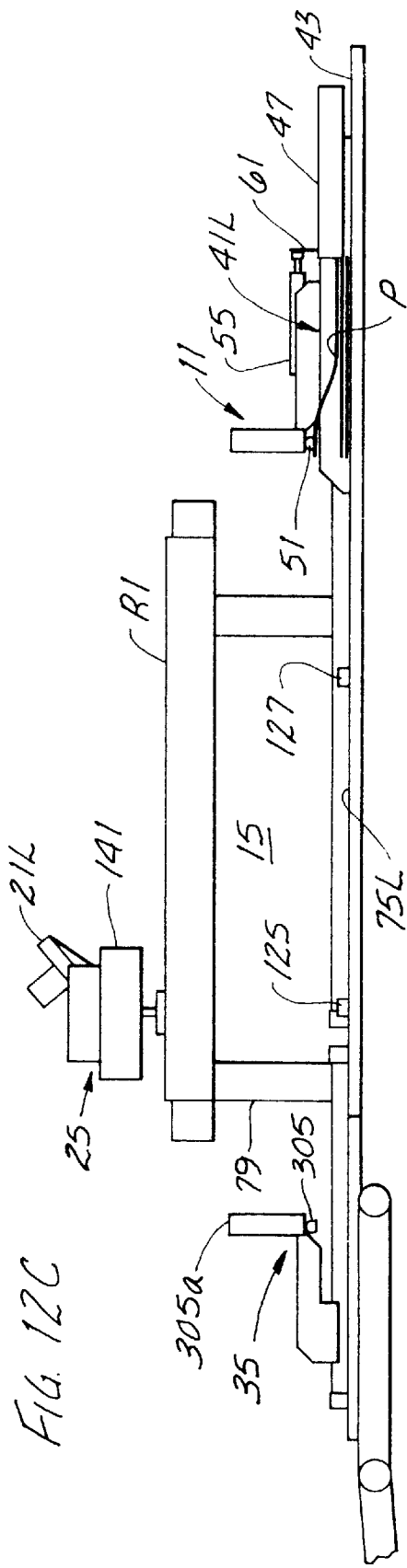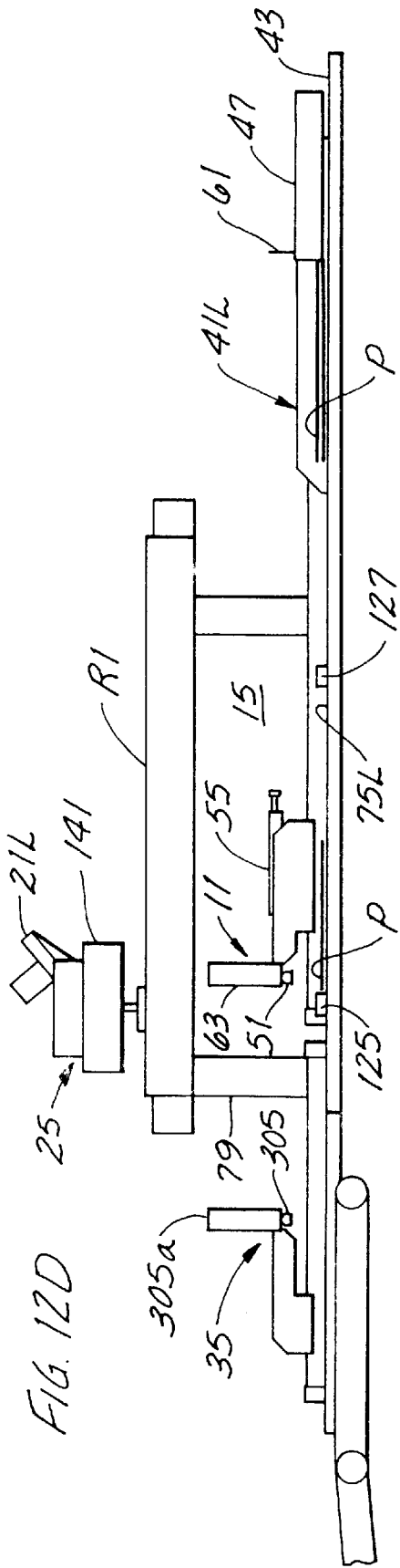

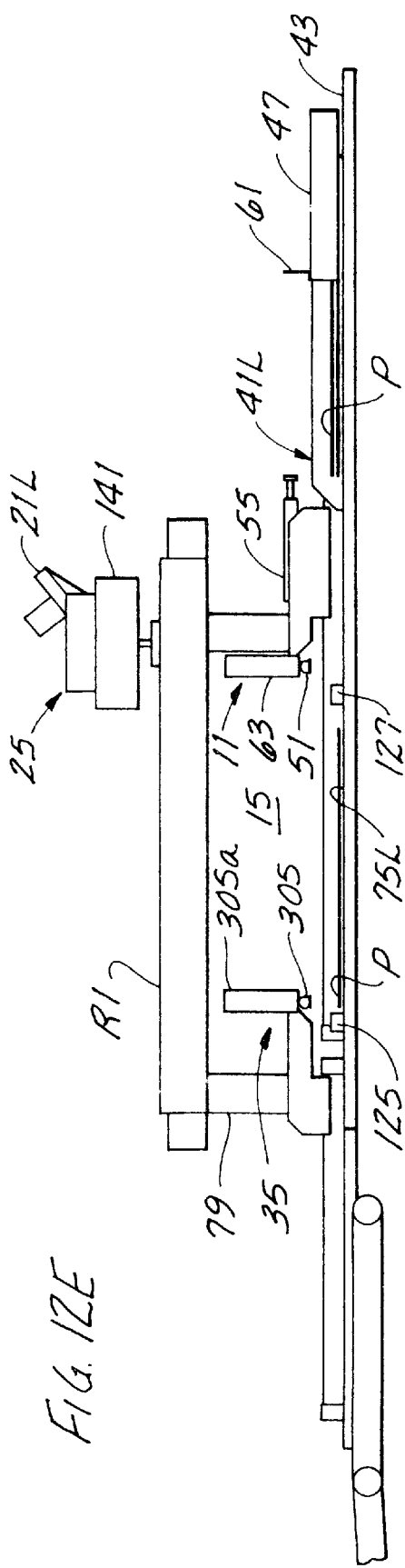
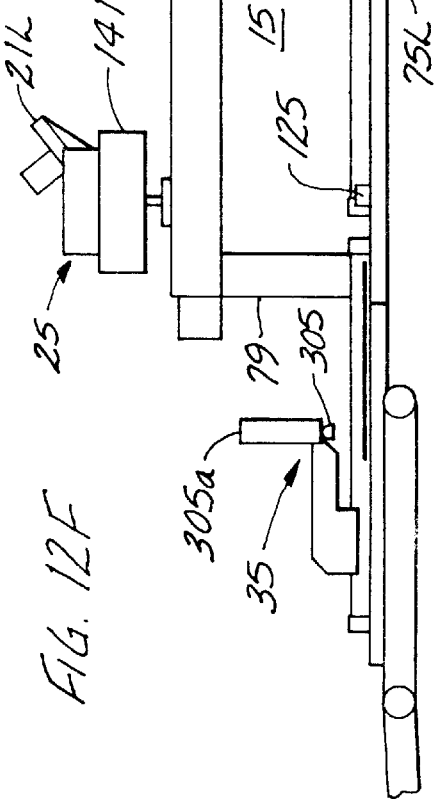

APPARATUS FOR AND METHOD OF EXPOSING LITHOGRAPHIC PLATES

This application is based on a provisional application, Ser. No. 60/048,674, filed Jun. 5, 1997.

BACKGROUND OF THE INVENTION

This invention relates generally to apparatus for and a method of exposing lithographic plates and, more particularly, to such apparatus and method which can be used to expose photosensitive or thermosensitive lithographic plates without the use of film.

Conventionally, photosensitive lithographic plates have been exposed to light through film. One type of apparatus designed to accomplish this in an automated manner is described in co-assigned U.S. Pat. No. 5,369,468, which is incorporated herein by reference. This apparatus is used particularly for newspaper printing operations to expose plates to light through photographic negatives of the newspaper pages. More recently, apparatus has been developed which uses laser technology to expose plates. This apparatus generally falls into three different categories; "flat bed" involving laser exposure of a plate on a flat bed; "internal drum" involving laser exposure of a plate mounted on an internal surface of a cylindric drum; and "external drum" involving laser exposure of a plate mounted on the external surface of a cylindric drum. Such apparatus are described in U.S. Pat. Nos. 5,174,205, 5,351,617 and 5,550,574, for example. By using laser technology to form an image directly on a plate, the need for film is completely eliminated. As a result, laser exposure systems are sometimes referred to in the trade as computer-to-plate imaging systems, or CTP systems. The present invention relates to such a system. In addition, the invention relates CTP systems which use lasers to form thermal images on thermosensitive plates.

SUMMARY OF THE INVENTION

Among the several objects of this invention may be noted the provision of an improved "flat bed" laser system (involving both method and apparatus) for exposing photosensitive lithographic plates or for heating thermosensitive lithographic plates without the use of film or heat shield, respectively; the provision of such a system which is capable of simultaneously exposing two separate single-wide plates, each having the same or a different image thereon, or a single double-wide plate, each half of which has the same or a different image thereon; and the provision of such system which is fully automated for delivering one or more plates to an exposure station, subjecting the plate(s) to an exposure operation, and then conveying the exposed plate(s) away from the exposure station.

In general, apparatus of the present invention comprises an apparatus for exposing photosensitive or heating thermosensitive lithographic plates without the use of film. The apparatus comprises:

a flat support for supporting a first plate and a separate second plate at an exposure station;

a conveyor system for conveying the first and second plates to the exposure station and depositing the plates on the support;

a first laser imager mounted at the exposure station above the support for generating a first laser beam adapted to sweep over the first plate along a first path;

a second laser imager mounted at the exposure station above the support for generating a second laser beam adapted to sweep over the second plate along a second path, said first and second paths being generally parallel to one another, and the sweep of the second laser beam over the second plate being independent of the sweep of the first laser beam over the first plate;

a mechanism for effecting simultaneous relative movement between the first laser imager and the first plate and between the second laser imager and the second plate in a direction generally perpendicular to said first and second paths swept by said laser beams, said laser imagers remaining in fixed positions relative to one another during said relative movement; and a computer system for receiving source image data corresponding to first and second source images, said first and second source images corresponding to first and second print images to be formed on said first and second plates, respectively, said computer system being operable for generating a first set of electrical signals corresponding to the first source image and providing said signals to the first laser imager, and for generating a second set of electrical signals corresponding to the second source image and providing said signals to the second laser imager, said first and second laser imagers being responsive to said first and second sets of electrical signals to modulate said first and second laser beams, respectively, said laser beams sweeping simultaneously over the first and second plates, respectively, in synchronization with said relative movement between the laser imagers and the plates whereby the first laser beam is adapted to expose certain portions of the first plate to form said first print image on the first plate and said second laser beam is adapted to expose certain portions of the second plate to form said second print image on the second plate.

The method of the present invention comprises a series of steps, including a method of exposing photosensitive or thermosensitive lithographic plates without the use of film or heat shield, respectively. The method comprising the steps of:

providing source image data corresponding to first and second source images, said first and second source images corresponding to first and second print images to be formed on first and second plates;

generating a first set of electrical signals corresponding to the first source image and providing said signals to the first laser imager;

generating a second set of electrical signals corresponding to the second source image and providing said signals to the second laser imager; and generating first and second laser beams adapted to sweep simultaneously and independently of each other across first and second plates, respectively, whereby said first laser beam is adapted to expose certain portions of the first plate to form said first print image on the first plate and said second laser beam is adapted to expose certain portions of the second plate to form said second print image on the second plate.

Other objects and features will be in part apparent and in part pointed out hereinafter.

BRIEF DESCRIPTION OF THE DRAWINGS

FIG. 4 is a vertical section on line 4—4 of FIG. 2;

FIG. 7 is an enlarged portion of FIG. 1 showing one end of bridge structure of the apparatus, parts being broken away to show details;

FIG. 8 is a view similar to FIG. 7 showing the opposite end of the bridge structure;

FIGS. 12A–12F are schematic views illustrating the operation of the apparatus in accordance with a method of this invention.

Corresponding parts are designated by corresponding reference numerals throughout the several views of the drawings.

DESCRIPTION OF THE PREFERRED EMBODIMENT

Figure 1:
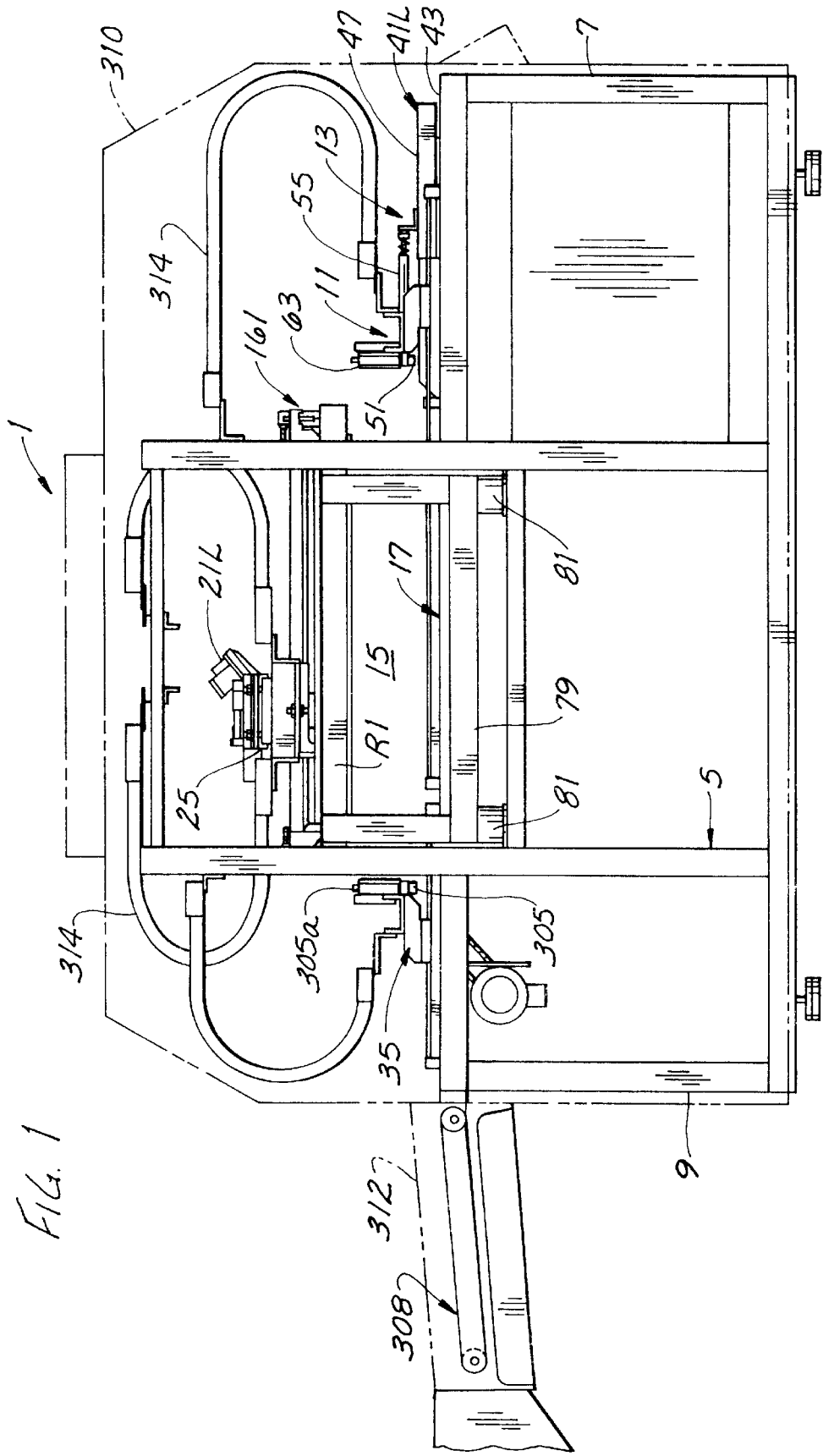
FIG. 1 is a side elevation of apparatus constructed in accordance with the present invention, the enclosures for the apparatus being shown in phantom.

Referring now to the drawings, apparatus of the present invention is designated in its entirety by the reference numeral 1. The apparatus is similar in certain respects to the apparatus described in U.S. Pat. Nos. 5,369,468 and 4,423,955 which are incorporated herein by reference, and the similarities will be pointed out during the description which follows. Apparatus 1 is designed for the automated exposure of photosensitive or thermosensitive lithographic plates P having a light-sensitive coating on one surface thereof. As used herein, "exposing" means subjecting photosensitive plates to light or subjecting thermosensitive plates to heat in order to create an image thereon. These plates are widely used in newspaper, book and magazine printing. Apparatus 1 operates to expose lithographic plates to light or heat without the use of conventional films (typically photographic negatives of the pages to be printed). For convenience, apparatus 1 will be described for use in exposing photosensitive plates although it is contemplated and readily apparent that it may also be used for exposing thermosensitive plates.

Figure 2:
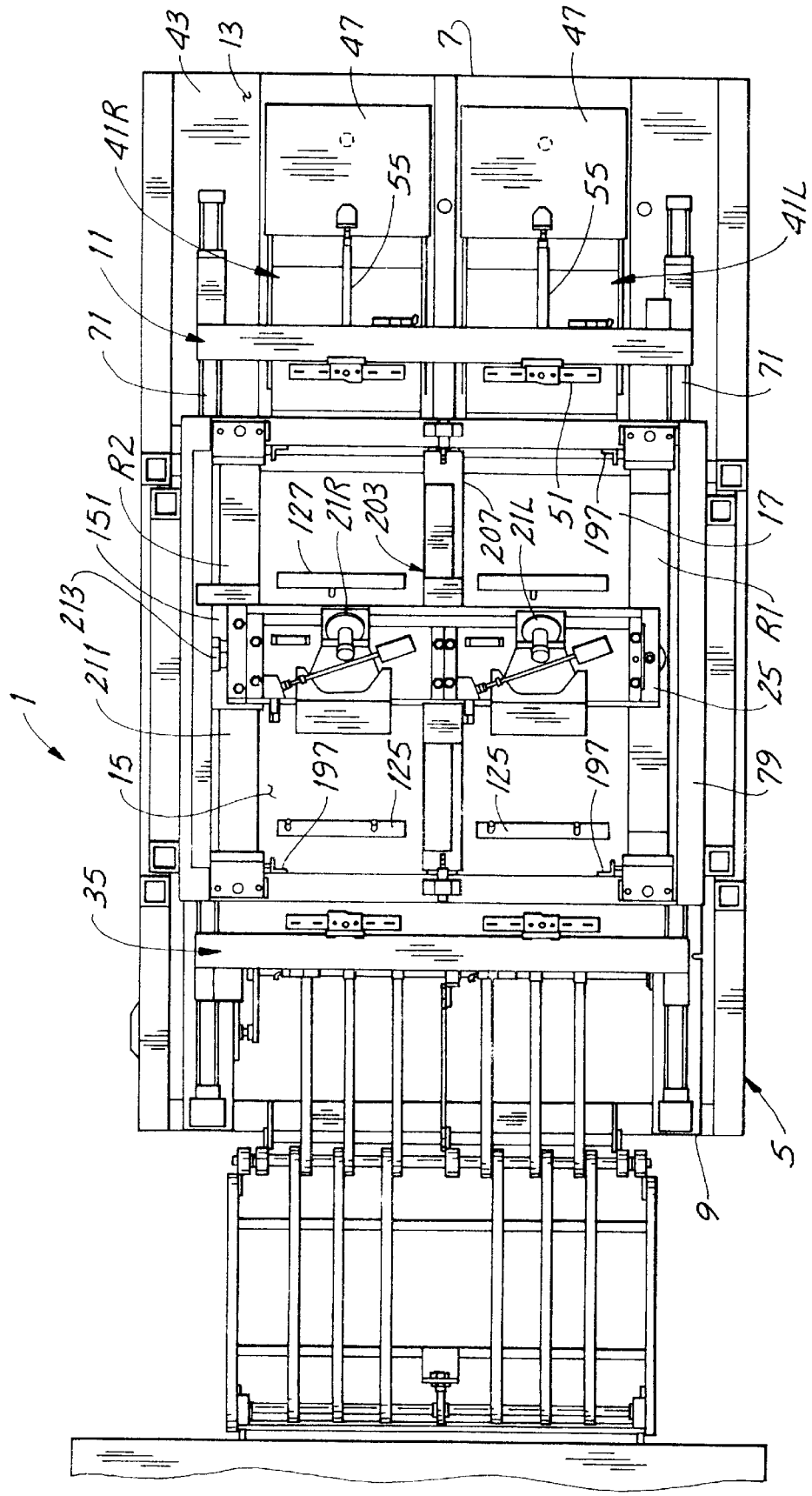
FIG. 2 is a top view of the apparatus of FIG. 1.
Figure 3:
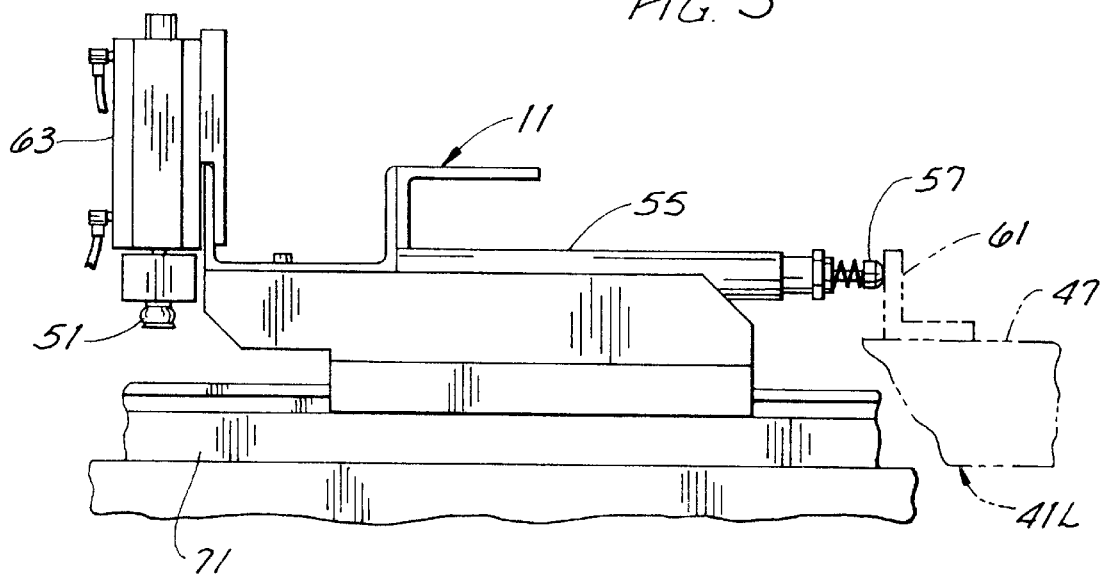
FIG. 3 is an enlarged portion of FIG. 1 showing an infeed carriage.

As shown in FIGS. 1 and 2, apparatus 1 comprises a main frame 5 having an infeed (right) end 7 and an outfeed (left) end 9, movement of the plates through the machine being from right to left in what may be referred to as a forward direction. In general, apparatus 1 also includes the following:

a) a first conveyor system comprising a first carriage 11, which may be referred to as an infeed or delivery carriage, for conveying two single-wide plates (e.g., a first plate Pi and a second plate P2) in a forward direction from a loading station 13 at the infeed (right) end of the machine to an exposure station 15 and depositing the plates on a flat support generally designated 17;

b) left and right laser imagers generally designated 21L and 21R, respectively, mounted on a laser transport carriage 25 moveable above the support 17 in forward and rearward directions;

c) a computer system generally designated 31 for controlling the two laser imagers 21L, 21R to generate modulated beams which sweep over the plates in a transverse direction with respect to the machine as the laser transport carriage 25 moves in a longitudinal direction with respect to the machine, thereby forming an image on each plate corresponding to a source image (e.g., an image which is to appear on a newspaper page) input into the computer system 31; and d) a second conveyor system comprising a carriage, generally designated 35, which may be referred to as an outfeed or discharge carriage, for conveying plates away from the exposure station 15 after an exposure operation is complete.

More specifically, lithographic plates to be exposed by apparatus 1 are stacked in two cassettes 41L, 41R supported side-by-side on a table 43 supported by the frame 5 at the loading station 13. Each cassette has a lid 47 slidable in a rearward direction against the bias of a spring (not shown) from a closed position in which the plates P therein are shielded from light, and an open position in which the top plate in the cassette is accessible for pick-up by the infeed carriage 11. The cassettes 41L, 41R are held in fixed position on the table by suitable means. The infeed carriage has two sets of vacuum grippers 51 for picking up two plates at a time, one plate from each cassette (see FIG. 4.) A pair of pusher rods, each designated 55, extend rearwardly from the infeed carriage 11 and have spring-loaded bumpers 57 at their rearward ends. As the carriage moves rearwardly from a start-up position, these bumpers are engageable with upright tabs 61 on respective cassettes 41L, 41R to open the lids 47, the carriage stopping in a position in which the vacuum grippers are disposed over the tops of the cassettes for pick-up of the top plate in each stack. The vacuum grippers 51 are moved between raised and lowered positions for picking up the plates by suitable actuators, such as pneumatic cylinders 63 controlled by pneumatic solenoid valves responsive to an in limit switch (ILS) and an out limit switch (OLS) communicating with a programmable logic controller (PLC) for controlling position (see FIG. 11.) The PLC controls the operation of the apparatus and is connected to a touch screen (see FIG. 11) for receiving operator input and for advising the operator of the status of the apparatus. A first set of sensors (e.g., photosensors 65L, 65R in FIG. 11) such as photoeyes communicates with the PLC and senses the presence of the cassettes 41L, 41R on the table. A second set of sensors (e.g., photosensors 67L, 67R in FIG. 11) communicates with the PLC and senses the presence of plates in the cassettes. Both sets of sensors are preferably mounted on the table 43. An up limit switch (ULS) and a down limit switch (DLS) for each set of cassettes communicates with the PLC to detect the position of the grippers 51.

The infeed carriage 11 is movable relative to the table 43 by conventional means (e.g., pneumatic rodless cylinders) along rails 71 at opposite sides of the apparatus (see FIG. 4) to carry the two plates gripped by the vacuum grippers 51 from the loading station 13 to the exposure station 15 where the vacuum grippers are adapted to deposit the two plates side-by-side on the support 17. The construction and operation of the infeed carriage 11 and its associated vacuum grippers is similar to that described in U.S. Pat. No. 4,423, 955.

The support 17 at the exposure station comprises two (left and right) vacuum platen assemblies 75L, 75R mounted in horizontal position on a subframe 79 which is supported in position by four vibration isolation mounts, each designated 81, at the corners of the subframe (see FIGS. 1 and 4.) The isolation mounts are attached to the main frame of the machine and function to prevent the transmission of vibration to the subframe 79 and the components carried thereby. The isolation mounts 81 are preferably air suspension units of the type commercially available from Kinetic Systems of Roslindale, Mass., under the trademark VIBRAPLANE® Model 1206.

Figure 6:
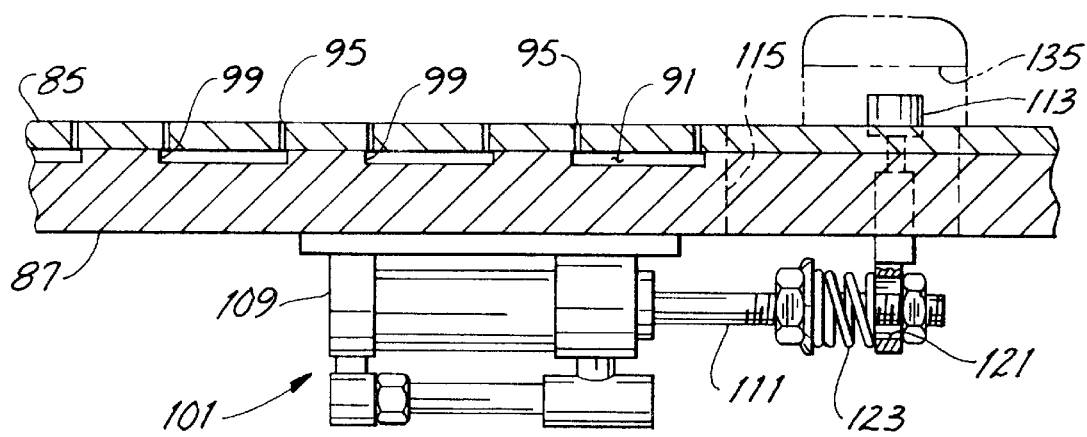
FIG. 6 is a section taken on line 6—6 of FIG. 5.
Figure 5:
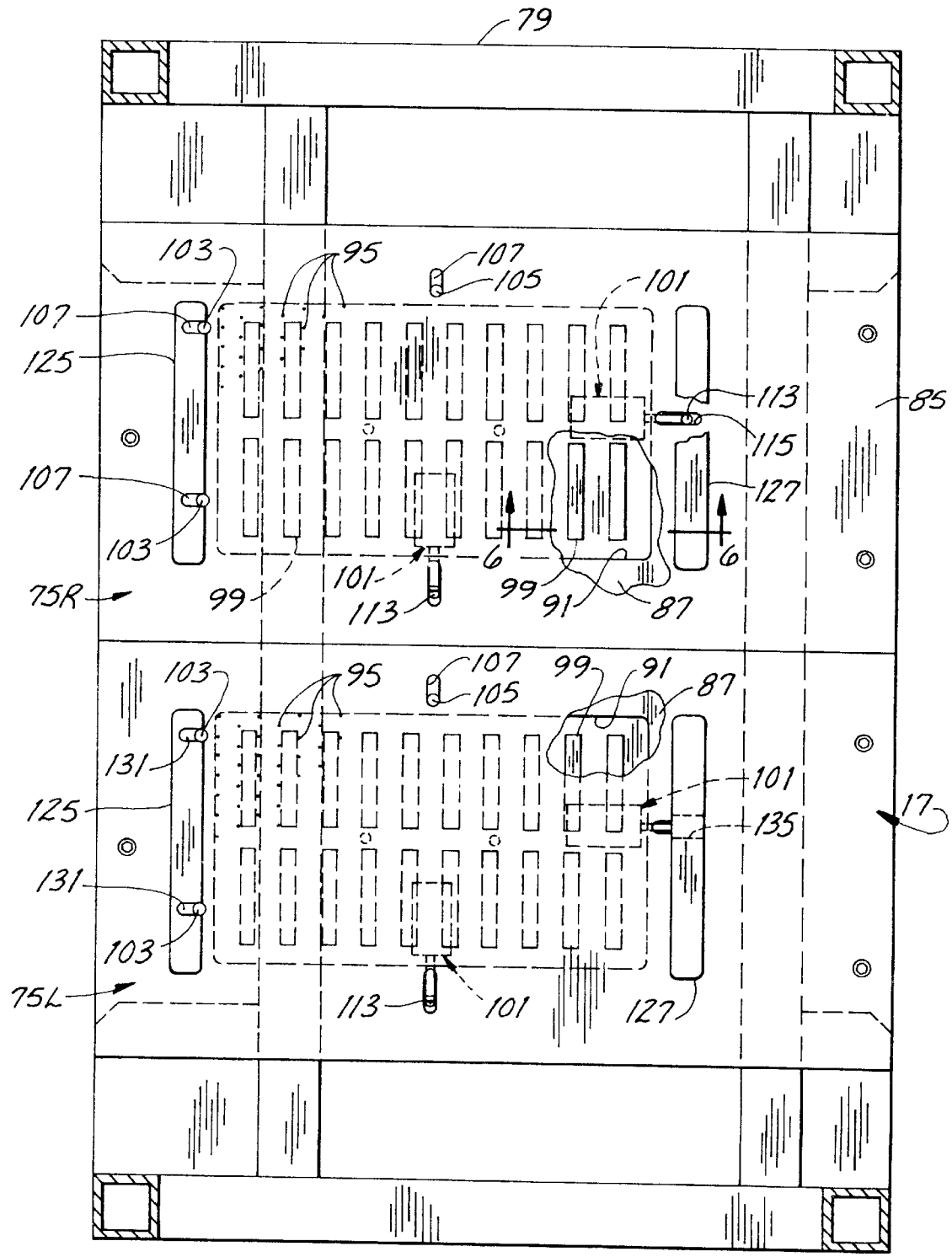
FIG. 5 is a plan of a flat support at an exposure station of the apparatus.

As shown in FIGS. 4–6, each platen assembly 75L, 75R comprises rectangular top and bottom platens 85, 87 secured together by fasteners. The bottom platen 87 has a vacuum cavity 91 formed therein generally corresponding in size and shape to a lithographic plate. This cavity communicates with a suitable vacuum generator (not shown) which includes a vacuum sensing switch 93. The top platen 85 has a multiplicity of vacuum holes 95 therein communicating with the vacuum cavity 91 to enable vacuum gripping of a plate resting on the top platen at the exposure station 15. The top platen is supported in fixed position against downward deflection into the vacuum cavity by a plurality of stand-offs 99 on the bottom platen, as illustrated in FIGS. 5 and 6.

Each platen assembly 75L, 75R also includes a plate positioning system for precisely positioning a plate P deposited on the top platen 85 so that the plate is in proper position for exposure. The positioning system comprises a pair of extensible and retractable pusher devices, each generally designated 101, mounted on the platen assembly, one for pushing the plate in a forward direction against a pair of end stops 103, and the other for pushing the plate in a lateral direction against a side stop 105 to precisely position the plate on the support 17. Each of the end and side stops 103, 105 preferably comprises a suitable cylindric roller mounted on the platen assembly for rotation about a generally vertical axis. Each stop 103, 105 is mounted in a slot 107 to permit limited positional adjustment of the stop relative to the top platen 85.

As shown best in FIG. 6, each pusher device 101 comprises a linear actuator which may be a pneumatic cylinder 109, for example, mounted on the underside of the bottom platen 87 and having an extensible and retractable rod 111 and a paddle member 113 attached to the rod and extending up through a slot 115 in the top and bottom platens 85, 87, the rod being retractable to move the paddle member into engagement with a plate on the platen to push the plate against the appropriate stop or stops 103, 105, and extensible to move the paddle member back to its home position. The paddle member 113 preferably has a pivotal connection with the cylinder rod 111 permitting limited pivotal movement of the paddle member about a horizontal axis extending generally perpendicular to the rod. This pivotal connection may be achieved, for example, by providing a cylinder-rod opening 121 in the paddle member which is configured to have some vertical clearance between the cylinder rod and the paddle member. A spring 123 on the rod biases the paddle member 113 toward a normally upright position. This arrangement provides for some "give" or movement of the paddle member against the bias of the spring when the paddle member initially engages a plate to prevent damage to the plate. The spring 123 also allows for some overtravel of the cylinder rod 111 as it extends and/or retracts in the event the paddle member engages a respective end of the slot 115.

Each of the two platen assemblies 75L, 75R also includes a front anti-scuffing bar 125 secured to the top platen 85 adjacent the end stops 103, and a rear anti-scuffing bar 127 secured to the top platen adjacent the paddle member 113 of the pusher device 101 for pushing a plate in a forward direction against the end stops 103. The bars 125, 127 are parallel and extend generally transversely with respect to the machine. The front bar 125 is formed with slots 131 in registry with the adjustment slots 107 for the end stops 103 (see FIGS. 4 and 5), and the rear bar 127 is formed with an undercut 135 in registry with the paddle-receiving slot 115 in the top and bottom platens. The front bar 125 has a height greater than the height of the end stops 103, and the rear bar has a height greater than that of the paddle member 113, the result being that the bars 125, 127 prevent a plate being conveyed to or away from a respective platen assembly 75L, 75R from engaging the paddle member and the end stops. Both bars are formed with smooth surfaces of a low-friction, relatively durable material which will not scuff or abrade the plates.

The laser transport carriage 25 comprises a bridge structure 141 movable along two rails R1 and R2 supported by the subframe 79 at opposite sides of the apparatus alongside the exposure station 15. One end of the bridge structure 141 (the left end as viewed in FIG. 4) is supported on its respective rail R1 by an air pad 143 which, when supplied with pressurized air, rides on a cushion of air along rail R1. As shown in FIG. 7, the elevation of the bridge structure 141 at this end is adjustable by a means of a threaded shaft 145 extending up from the air pad through a clearance hole 147 in the bridge structure, and a pair of jam nuts 149 threaded on the shaft engageable with upper and lower surfaces of the bridge structure, the elevation of the bridge structure being adjustable by threading the lower jam nut to the desired position and then tightening the upper jam nut. The opposite (right in FIG. 4) end of the bridge structure 141 is supported on a pair of tubular sliders 151 (see FIG. 8) slidable on rail R2, the configuration of the sliders conforming to that of the rail so that movement of the bridge structure along the rail R2 can be closely controlled. Air under pressure is supplied through fittings (not shown) into a small annular gap between each slider 151 and the rail R2 so that the slider rides on a friction-free cushion of air along the rail. As shown in FIG. 8, the elevation of the bridge structure 141 at this (the right) end of the structure is adjustable by means of threaded shafts 155 extending down through clearance holes 157 in the bridge structure into engagement with the bridge structure, and upper and lower jam nuts 159 threaded on the shafts 155.

Figure 9:
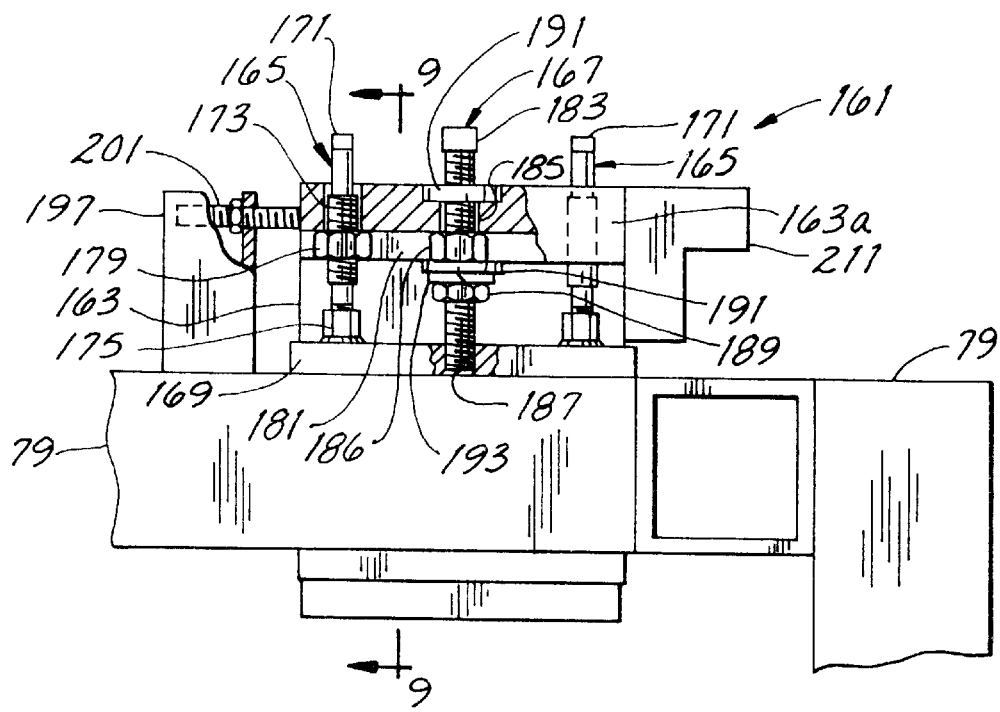
FIG. 9 is an end view of a mechanism for adjusting the position of a rail for the bridge structure.
Figure 10:
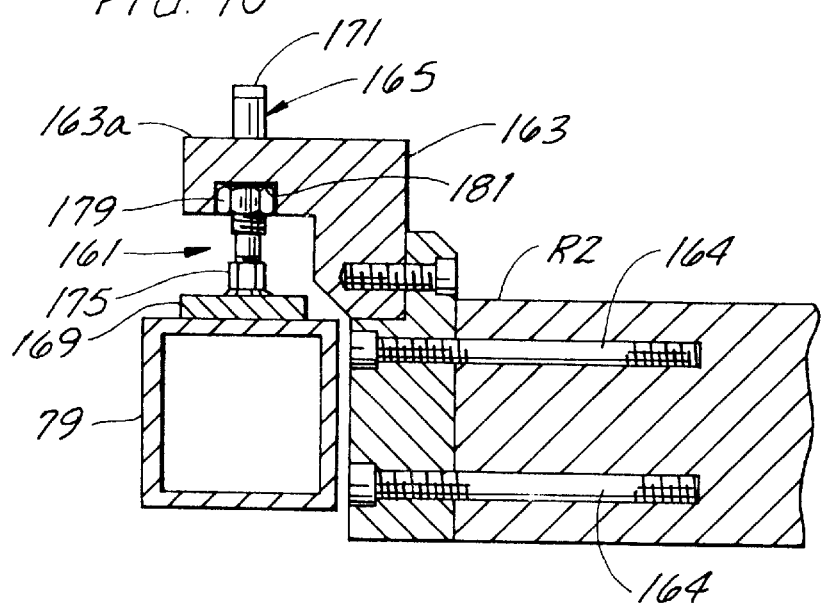
FIG. 10 is a section taken on line 10—10 of FIG. 9.

A rail positioning system, generally designated 161, is provided at each end of each of the two rails R1, R2 for adjusting the pitch and roll of each rail to ensure that the upper surfaces of the rails are horizontal and coplanar. One such system is shown in FIGS. 9 and 10. As shown, the system comprises an L-shaped end piece 163 attached (e.g., bolted) to the end of the rail via fasteners 164, and a pair of adjustment screw assemblies, each generally indicated at 165, and a center bolt assembly generally designated 167, extending down through a top cantilever portion 163a of the end piece into engagement with a pad 169 affixed to the subframe 79. Each of the adjustment screw assemblies 165 comprises an adjustment screw 171 extending through a clearance hole 173 in the end piece 163a into engagement with a swivel nut 175 which bears on the pad 169. The screw 171 threads through a nut 179 held against rotation in a channel recess 181 in the underside of the cantilever portion 163a of the end piece, the arrangement being such that rotation of the adjustment screw 171 in one direction raises one side of the rail R1 or R2 and rotation in the other direction lowers that side of the rail. Thus, by using the two adjustment screw assemblies 165, the pitch and elevation of a respective rail may be precisely adjusted.

The center bolt assembly 167 is used to support the rail and to lock it in its desired position after using the adjustment screws 171. This assembly comprises a bolt 183 extending down through a clearance opening 185 in the cantilever portion 163a of the end piece 163 into threaded engagement with a tapped hole 187 in the pad 169. A nut 186 threaded on the shaft against rotation and held in recess 181 is engageable with the cantilever portion 163a of the end piece to support the rail at the desired position. A jam nut 189 is used to lock the nut 186 in position. Spherical washers 191 are provided below the head of the bolt 183 and above the jam nut 189 to prevent binding. A lock washer 193 between the jam nut 189 and the underside of the cantilever portion of the end piece is also provided. As best illustrated in FIGS. 2 and 9, angle brackets 197 are secured to the subframe 79 at opposite ends of each rail R1, R2. Screws 201 threaded through these brackets 197 are engageable with side faces of the rails R1, R2 to provide lateral stability to each rail.

The bridge structure 141 is moved along the rails R1, R2 by a linear motor, indicated generally at 203 in FIG. 4. This motor may be, for example, a brushless sinusoidal dc linear servo motor specifically designed for extremely smooth and precise motion, such as is commercially available from Anorad Corporation of Hauppauge, N.Y., Model No. LA-S, "Anoline Series". The motor 203 is attached to the underside of the bridge structure 141 at the center of the structure and is operable to drive the carriage along a support beam 207 secured at its ends to the subframe (see FIG. 2). The linear motor drives the bridge structure in both forward and rearward directions and thus constitutes a mechanism for effecting simultaneous relative movement between the two laser imagers 21L, 21R and two stationary lithographic plates P, P on the platen assemblies 75L, 75R therebelow, the movement being in a direction extending longitudinally with respect to the apparatus 1 and the two plates at the exposure station. The two laser imagers remain in fixed position relative to one another during this movement. The precise longitudinal position of the bridge structure 141 and laser imagers 21L, 21R relative to the machine is sensed by a linear encoder E (FIG. 11) comprising a horizontal encoder bar 211 having a strip of encoded tape thereon extending between the two end pieces 163 on rail R2, and a reader 213 mounted on a bracket 215 attached to the bridge structure for reading the encoded tape as the bridge structure reciprocates on the rail R2 (see FIGS. 4 and 8.) The encoder E provides position feedback information to a linear motor servo controller (see FIG. 11) which controls the operation of the linear motor 203 and which is responsive to the PLC. The encoder E constitutes a position detector for detecting the position of the laser transport carriage 25 relative to the plates on the support and providing to the PLC (via a servo controller) a position signal indicating the position of the carriage relative to the plate or plates. The PLC responds to position signals received to generate the first and second sets of electrical signals provided to the laser imagers 21.

The two laser imagers 21L, 21R are mounted on separate bases 221 supported on three pads 225 affixed to the bridge structure, one pad being located at the center of the structure and the other two pads at opposite ends of the structure, as best illustrated in FIGS. 4, 7 and 8. The elevation of each laser imager is adjustable by adjusting the height of its respective base 221, one end of which is located above the center pad 225 and the other end of which is located above one of the end pads 225. This adjustment is effected by means of four adjustment screws 231 threaded down through tapped holes 233 in the base 221 into engagement with respective support pads 225, the screws being rotatable in one direction to raise the base and its respective laser imager, and rotatable in the opposite direction to lower the base and the laser imager (see FIGS. 7 and 8.) A locknut 235 on each screw 231 holds the base 221 at the proper elevation. The base is secured to the bridge structure 141 by bolts 237 which extend down through center bores in the adjustment screws 231 and into tapped holes 241 in the support pads 225. It will be observed from the foregoing that the laser imagers 21L, 21R are independently adjustable with respect to one another so that the height of each imager above a respective platen assembly 75L, 75R can be appropriately adjusted.

Each laser imager 21L, 21R is capable of generating a laser beam adapted to sweep over (scan back and forth) a respective plate at the exposure station 15 along a path extending transversely with respect to the plate to form an image on the plate corresponding to a source image input into the computer system 31. This source image may, for example, be an image which is to appear on a newspaper page. As will be described in greater detail below, each laser imager is operable independently of the other laser imager so that it may form the same or a separate image on its respective plate. The laser imager 21L, 21R may be either a holographic laser scanning system using a rotating disc to refract light passing through the disc to form a modulated scanning beam, or a polygon scanning system using mirrors to reflect light to form such a beam. Other types of systems may also be used in the present invention. A suitable holographic system is commercially available from Holotek Ltd. of Henrietta, N.Y. By way of example, such a system may be configured to generate a laser beam having a wavelength of 532 nanometers, with an addressability of 1000–1270 dots per square in., a focal distance of 19.5 in., a scan width of 13.67 in., and a scan thickness of 27 microns. A light shield 251 (FIG. 4) is secured to the underside of the bridge structure 141 for preventing interference between the laser beams generated by the two laser imagers 21L, 21R.

In general, the source image is a bit map such as a TIF file which has been previously generated by a raster image processor (RIP) which is part of the aforementioned computer system 31. The computer system provides to a print spooler 300 left and right source images for the left and right imagers 21L, 21R for exposing the plates at the exposure station 15. The print spooler simultaneously outputs the left and right source images via left and right interface cards 302L, 302R to the left and right imagers 21L, 21R. The interface cards may be any buffered system such as a PCI Setter Interface—Pel Box Interface (Product Code PIP X000) for delivering serial data to the imagers. The output images are provided in synchronism to the two imagers one line at a time at about a 4 MHz clock rate.

Figure 11:
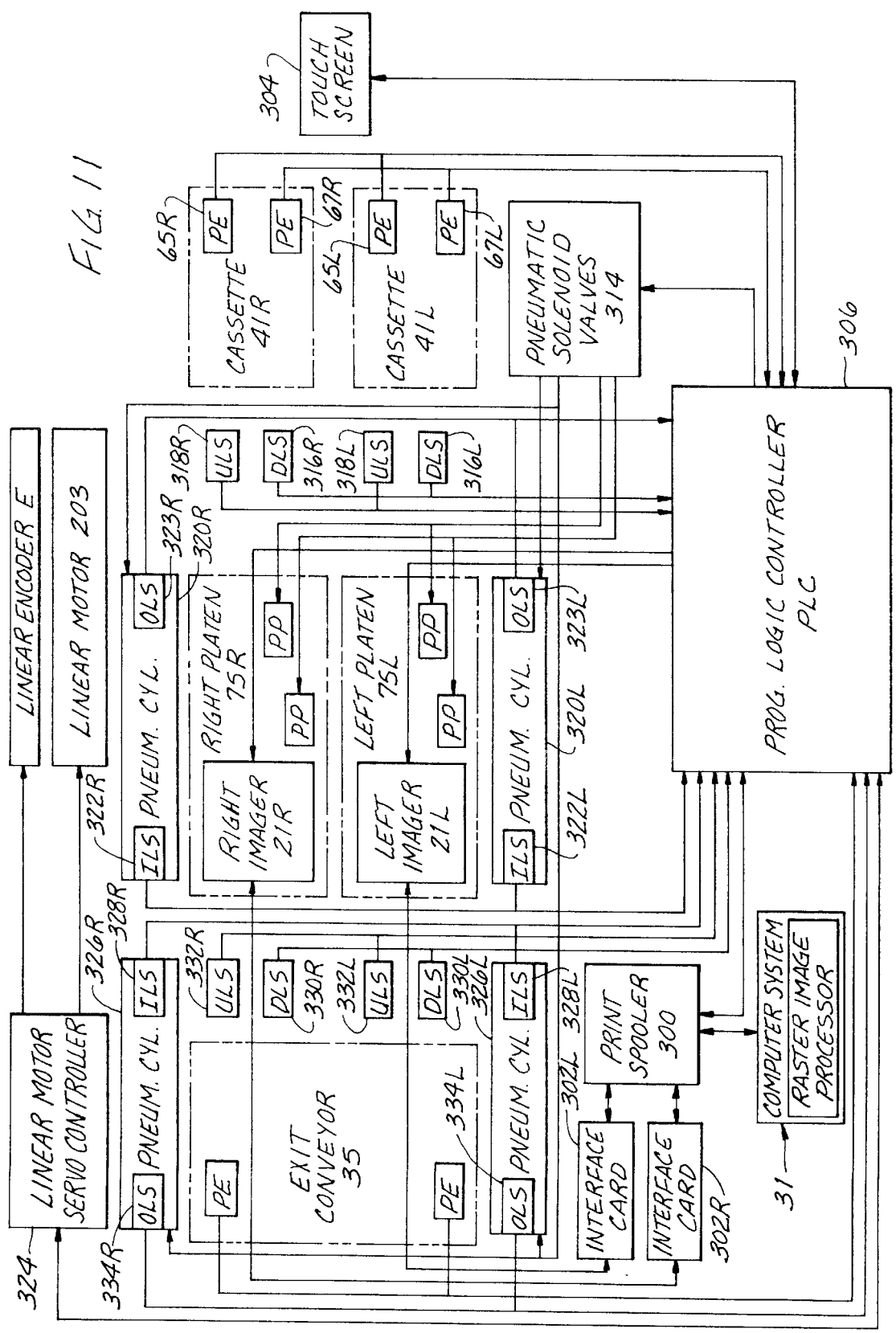
FIG. 11 is a block diagram of the electronics for the apparatus.

Referring to FIG. 11, the print spooler 300 is a software system of the type well known in the art and is used to facilitate the throughput of images in a RIP format to the imagers. The spooler is configured to run a single or multiple queue system with a choice of applications for each queue. The system can be set up with a single queue, for example, to perform plotting which cannot run in parallel with other activities due to bandwidth restrictions. Alternatively, the system can be set up with multiple queues where an activity from each queue can be done in parallel, for example, proofing and archiving. A combination of queue types can also be configured. This design allows for completely automatic throughput of source images from the RIP format to the imagers, which is particularly useful during typesetting. Queues and any other information are stored in ASCII form and mirrored in memory such as on a local hard drive of the computer system. This enables the system to be restarted without loss of information. A semaphore system may be used to protect the files from simultaneous update by multiple processes.

The print spooler 300 is implemented via three multiple processes in multiple cooperation: a queue feeder dameon (QFD) responsible for setting up the queues; a queue execution dameon (QED), one for each queue responsible for starting the application task (AT) associated with each queue entry; and an optional user interface (UI) process for queue manipulation. Interprocess communication is accomplished via standard platform facilities such as IPC. The requirements for the number of queues, the operations on the queue items, where the files are to be found and other QFD features are determined by the system configuration file which is read by the QFD at start up.

The queue feeder dameon (QFD) performs the following operations. Initially, the QFD creates a queue execution dameon (QED) for each configured queue. The QFD also monitors the configured network-wide directories for new jobs to process. When a new job is found, the QFD moves the job to a designated local directory in order to permit for real time output. In the case that slow and/or non-real-time operations are required, or in a case that the system is part of a very fast network, files can be accessed directly by an application task without the need for making an intermediate copy. The QFD adds an entry to each configured output queue for each new job for a system with several similar/identical output devices. The queue used may be configured from a specific device or may be configured to allow the QED a choice of available devices. Finally, the QFD insures the disk based queues are consistent and mirrored.

Each QED performs the following operations. Initially, it monitors a queue and starts the associated application task for the next entry based on its priority. Throughout operation, the QED communicates with the application task to track its activity and to report progress and/or error situations. Optionally, the QED transmits user information, progress and errors back to the user interface for display on a touch screen 304. In addition, the QED accepts optional user interface commands such as "abort job," "start/stop QED" and other control commands. In a system with several similar/identical output devices, the QED optionally finds the best device for the application task to use after termination of the application task, the QED cleans up the queue and puts the configurable retry procedures into effect if termination is premature due to, for example, hardware failure. Finally, the QED does file housekeeping after completion of the job such as moving the job to another directory, deleting the job or other clean up. The QED also insures that the task is restarted if multiple plates are required from the same job. While operating, the QED keeps a disk-based log of application task start/stop times and errors.

The print spooler 300 supports a large number of features which are designed for activation via the touch screen 304 of the user interface. It is contemplated that the print spooler will allow for the addition of new features which may not be required in fully automatic systems but which may be necessary or preferable in interactive systems.

The user interface (UI) performs the following functions. The user can start or stop a queue at any point. The dameons can be turned off so that a manual output system can be used, for example, the scheme of placing jobs on a layout before triggering output manually as used in many types of plotters. Starting or stopping the dameons is not instantaneous—current operations are completed first and an acknowledgment is used to confirm completion. Dameons are not automatically started on system boot when using a user interface but do start on a completely automatic system. The user interface also accomplishes queue reordering. A medium priority is initially associated with each queue entry. Job priorities can be adjusted upwards or downwards by the operator to change the order of processing. Jobs with the same priority are processed in first in, first out (FIFO) order. The user interface also allows a job to be held to insure it is not activated until required. For example, it may be essential to await a proof before making a plate. Jobs can be put on "hold" or removed from a "hold" status at any time.

The user interface also aborts jobs at any time in response to operator input. However, due to IPC delays and hardware restrictions, such aborted jobs may not be instantaneous. An acknowledgement is used to confirm the abort.

The user interface also allows queues to be permanently visible as status information or allows queues displayed on demand. The display shows the job names in priority order, complete with status such as "on hold" or "outputting." The user interface also allows a job to be removed from a queue at any time, unless it has already started processing. In this case, the "abort job" command noted above must be used to eliminate the job.

This log is maintained on disk and can be displayed and scrolled by the operator via touch commands. The user interface also has a configuration option so that jobs may be saved or archived after processing. Such a job can be retrieved and re-queued for processing at a later time via this option.

The application tasks (AT) may be as follows: output the queue item to the designated plate maker; output the queue item to the designated imager; output the queue item to the designated proofer; or copy the queue item to the designated medium and delete the item. Moving the files around the computer system to a specific output directory is preferably part of the application task operation. However, a separate, specific application task (AT) such as a file mover may be used to simplify the organization of files and the location of files at the correct places so that the AT would be independent of its environments. Similarly, the decompression, low resolution generation and RIP interlocking could be part of the existing application task or each could be a completely separate and independent application task.

The application tasks determine their own task requirements and parameters from the queue information. To remove/reduce dependencies, the queue dameons have no knowledge of application task operations unlike some other systems where the user interface generates plotting parameters. As noted above, the tasks required are configurable and would be initiated as tasks by the QED on demand.

The outfeed carriage 35 is movable on rails from a forward or "home" position at the outfeed (left) end 9 of the apparatus 1, to a rearward position at the exposure station 15 for picking up the two plates P after they have been exposed, and then back to the stated forward position. The construction of this carriage is similar to that described in U.S. Pat. No. 4,423,955. It has two sets of vacuum grippers 305 movable up and down by pneumatic cylinders 305A on the outfeed carriage 35 in response to an up limit switch ULS and a down limit switch DLS communicating with a PLC 306. The grippers are operable to grip the plates on the platen assemblies 75L, 75R, to hold the plates as the outfeed carriage moves to its forward position, and to release the plates onto an exit belt conveyor 308 for conveyance of the plates from the machine. A third set of sensors (e.g., photosensors) is provided for sensing the presence of exposed plates on the exit belt conveyor.

Apparatus 1 is enclosed within a housing 310 shown in phantom in FIG. 1. Similarly, the belt conveyor 308 is enclosed within a suitable light-tight enclosure 312 (e.g., a flexible bellows-type shroud) to shield the exposed plate from light or heat as it is conveyed to a plate processor which uses suitable chemicals to develop the plate, as will be understood by those in this field. In addition, moving electrical parts may be interconnected to the apparatus by flexible conduits 314, as is known in the art.

In operation, the operator places the photosensitive or thermosensitive lithographic plates to be exposed into the light-tight (or heat insulated) cassettes 41L, 41R and then places the cassettes on the table 43 at the loading station 13 (FIG. 12A). Using the user interface (e.g., touch screen 304 in FIG. 11), the operator actuates pneumatic cylinders (not shown) that lock the cassettes in place. The operator then instructs the PLC through the touch screen to open the lids 47 of the cassettes 41L, 41R. This actuates the pneumatic cylinders 320L, 320R (FIG. 11) to move the infeed carriage 11 in a rearward direction toward the cassettes thereby opening the lids on the cassettes (see FIG. 12B). The carriage stops at a location wherein the vacuum grippers 51 are positioned above the forward end portions of the top plates in the cassettes. The photosensors 67L, 67R mounted on the table 43 detect the presence of the cassettes. The second set of photosensors 65L, 65R mounted on the table detect the presence of the lithographic plates in the cassettes. The PLC receives the output signals from these sets of photosensors and the apparatus is now ready to begin the imaging cycle.

The imaging cycle can only begin if an image file of source image data is available in one of the queues of the print spooler 300 to be ready to be clocked to the imager. For purposes of this description of the operation of the apparatus, it is assumed that two image files of source image data are present in the print spooler. When image files are present in the queues of the print spooler 300 for the right and left imagers 21L, 21R, the print spooler sends a left PAGE ADVANCE signal to the left imager 21L electronics control unit via the interface card 302L (see FIG. 11). The electronics control unit passes the PAGE ADVANCE signal to the PLC 306. At that point, the PLC is programmed to wait for a brief period to determine whether the print spooler will send a right PAGE ADVANCE signal through the interface card 302R to the electronics control unit of the right imager 21R. Since this description of operation assumes two image files, the print spooler would send a right PAGE ADVANCE signal. After the right and left pairs of photosensors 65, 67 detect cassettes 41L, 41R and lithographic plates P in the cassettes, the plate pick-up sequence begins.

The PLC 306 sends actuation signals to the pneumatic solenoid valves 314 responsible for directing air to the up/down pneumatic cylinders 63 controlling the grippers 51 of the infeed carriage 11. Initially, the PLC opens the appropriate valves to operate the pneumatic cylinders 63 to move vacuum grippers 51 to a down position. The PLC also sends actuation signals to the solenoid valves 314 responsible for activating vacuum generators (not shown) to enable the grippers to vacuum grip the plates. The vacuum generators include vacuum sensing switches. When the vacuum is acquired, indicating that the grippers are in engagement with the plates, the switches send signals to the PLC which then actuates the solenoid valves responsible for directing air to the up/down pneumatic cylinders 63 to move the grippers to their up position to lift the front ends of the plates out of their respective cassettes (see FIG. 12C).

The PLC receives the up limit switch (ULS 318) signal when the grippers are in the fully up position. The PLC then sends actuation signals to the solenoid valves responsible for directing air to the in/out (rodless) pneumatic cylinders 320 responsible for moving the infeed carriage 11 and the two plates carried thereby from the loading station 13 to the exposing station 15. When the carriage arrives at the exposing station, as detected by an in limit switch (ILS 322), the PLC sends actuation signals to the solenoid valves 314 responsible for directing air to the up/down pneumatic cylinders 63 to move the grippers 51 to their down position to deposit the plates on the upper platens 85 of respective platen assemblies 75L, 75R, with each plate being disposed between front and rear anti-scuffing bars 125, 127 (see FIG. 12D). Upon receiving the down position switch signal from the down limit switch (DLS 316) indicating that the grippers are in their fully down position, the PLC sends actuation signals to the solenoid valves 314 responsible for directing air to the vacuum generators blow off circuit (not shown) to eliminate the vacuum. Since the plates are now in position on the upper platens 85 at the exposing station, the grippers 51 can be disengaged from the plate by eliminating the vacuum. Next, the PLC 306 sends actuation signals to the solenoid valves 314 responsible for directing air to the up/down pneumatic cylinders 63 to raise the grippers. When the up limit switch (ULS 318) indicates that the cylinders and associated grippers are in their fully up position, the PLC responds to the up position signal and actuates solenoid valves 314 responsible for directing air to the in/out pneumatic cylinders 320 to move the infeed carriage 11 back to the loading station 13, the arrival of the carriage at the loading station being signaled by an out limit switch OLS 323 (FIG. 11). This preceding process roughly positions each of the two lithographic plates to be exposed on a respective platen 85 between the anti-scuffing bars 125, 127.

Next, the PLC sends a signal to each electronics control unit of the right and left imagers 21R, 21L to begin opening laser shutters (not shown) so that the shutters can be opened while the apparatus is executing a cycle for precise positioning of the lithographic plates. This cycle employs the pusher devices 101 to push the plates into precise position. The PLC sends actuation signals to the solenoid valves 314 responsible for directing air to the cylinders 109 of the pusher devices 101 at the rearward ends of the plates to cause the rods 111 of the cylinders to retract. This retraction causes the paddle members 113 to engage the plates and to push them in a forward direction against the end stops 103. The PLC then sends actuation signals to the solenoid valves 314 responsible for directing air to the cylinders 109 of the pusher devices 101 at one side of the plates to cause the rods of the cylinders to retract, thereby causing the paddle members 113 of the devices to engage respective sides of the plates and to push them sideways against side stops 105. After the plates have been thus moved to precise positions as established by the end and side stops, the PLC sends actuation signals to the solenoid valves 314 responsible for activating the vacuum generators to establish a vacuum in the cavity 91 to hold the plates in fixed position at the exposure station. The vacuum system includes vacuum sensing switches (not shown) which provide signals to the PLC when the vacuum is acquired indicating that the lithographic plates to be exposed have been positioned and are being held in place. With the plates positioned, the PLC sends imager ready signals to the electronics control units of the right and left imagers 21.

During the plate positioning, the print spooler 300 begins placing the files to be used for exposing the plates in the computer memory queue. Once half of each of the files is placed in memory, the print spooler begins polling the electronics control units of the imagers 21L, 21R for the IMAGER READY and SIGNAL from each imager. The print spooler receives two IMAGER READY signals, one from the left imager 21L and one from the right imager 21R. The print spooler then polls each of the imagers again to verify that they are indeed ready. After this verification, the print spooler sends a TRANSPORT GO signal to each electronics control unit of the imagers. The PLC also receives the TRANSPORT GO signal via the electronics control units. Upon receipt of the TRANSPORT GO signal, the PLC sends a signal that activates the linear motor 203 to move the laser transport carriage 25 at the proper speed for the selected image resolution.

Initially, during this exposing cycle, the motor 203 accelerates laser transport carriage 25 to the proper speed. When the carriage reaches the desired speed, a servo controller 324 then sends an AT SPEED signal to the PLC. The carriage with the imagers is now moving toward a predetermined image start point. The linear motor servo controller next sends an IN POSITION signal to the PLC when the carriage reaches the start point. The AT SPEED and IN POSITION signals are combined through an AND gate (not shown) and simultaneously sent to the print spooler through the electronics control units of the imagers.

Each laser imager utilizes its disc mirror and photodetector combination to detect the beginning of each scan line. When the electronics control unit of the imager detects a scan line, a START OF SCAN (SOS) signal is sent to the print spooler 300 requesting a string of data equivalent to the one line of the image. The electronics control unit uses this information to drive the modulator. The modulator modulates the laser beam, turning the beam on and off in a pattern that represents the data stream. The beam scans across the lithographic plate exposing photosensitive material or heating thermosensitive material on the plate in the pattern represented by the data. The print spooler waits for the next scan line signal SOS before outputting more data. The process repeats itself line-by-line until the image is complete (see, for example, U.S. Pat. Nos. 5,174,205 and 5,351,617 incorporated herein by reference). The entire process occurs simultaneously with both imagers. In addition, it is noted that the imagers may be provided with different data streams to simultaneously print two different images. After completing the exposing of the image, the print spooler rescinds the TRANSPORT GO signals and the PLC closes the laser shutters in response thereto. Next, the PLC issues a signal to the linear motor servo controller 324 that sends the laser transport carriage 25 back to its home position at four times the normal imaging speed. The PLC then sends a signal to the solenoid valves responsible for directing air to the platen vacuum generators to cut off the vacuum and release the plates from their respective platens 85.

Next, the PLC sends actuation signals to the solenoid valves 314 responsible for directing air to in/out pneumatic cylinders 326 of the outfeed carriage 35. These signals cause the cylinders to retract inwardly to move the carriage in a rearward direction to the exposure station to a position where the vacuum grippers 305 on the carriage are positioned for pick-up of the exposed plates (see FIG. 12C). When the carriage 35 arrives at this position, as detected by an in limit switch (ILS 328), the PLC receives the "in position" signal from the ILS switches and actuates solenoid valves 314 responsible for directing air to the pneumatic cylinders 305A to cause the grippers 305 to move downwardly to contact the exposed plates. When the PLC receives signals from a down limit switch (DLS 330) indicating that the cylinders 305A are in the fully down position, the PLC sends actuation signals to the solenoid valves 314 responsible for activating the vacuum generators so the grippers vacuum grip the plate for pick up. These vacuum generators include vacuum sensing switches. The PLC receives a signal from these switches indicating that the vacuum has been acquired and that the grippers of the discharge carriage are in engagement with the plates.

Next, the PLC sends actuation signals to the solenoid valves 314 responsible for directing air to the cylinders 305A to lift the front portions of the plates. When an up limit switch (ULS 332) indicates that these cylinders are in the fully up position, the PLC sends actuation signals to the solenoid valves 314 responsible for directing air to the in/out pneumatic cylinders 326 to move the outfeed carriage 35 in a forward direction. When an out limit switch (OLS 334) indicates that a cylinder 326 is in its outermost position, the PLC sends actuation signals to the electric motor (not shown) responsible for activating the exit conveyor 308. The PLC then sends actuation signals to the solenoid valves responsible for directing air to the pneumatic cylinders 305A of the outfeed carriage to move the grippers 305 down to deposit the exposed plates on the exit conveyor (FIG. 12F). When the down limit switches (DLS 330) indicate that such cylinders 305A are in the down position, the PLC sends actuation signals to the solenoid valves responsible for directing air to the vacuum generators blow off circuit to release the plates. The PLC then sends actuation signals to the solenoid valves responsible for directing air to the up/down cylinders 305A to move the grippers 305 to their fully up position. When the up limit switch (ULS 332) indicates that these cylinders are in the fully up position, the PLC waits for the lithographic plates to exit the apparatus. The exit conveyor 308 moves the lithographic plates out of the apparatus. As the plates move along the exit conveyor, they encounter a final pair of photosensors which provide a signal to the PLC indicating that the plates have exited the apparatus, after which the PLC sends a signal to stop the exit conveyor.

While the foregoing describes the apparatus 1 as exposing two single wide plates during each cycle of operation, it will be understood that this apparatus is also operable to expose one double-wide plate during each cycle of operation.

It will also be understood that the laser imagers 21 could scan in a longitudinal direction with respect to the plate P at the exposure station and that the laser transport carriage 25 could move in a transverse direction with respect to the plate. Furthermore, the laser imagers may be stationary and the lithographic plates to be exposed may be moved relative to the laser imagers in order to expose the plate.

In addition, the laser imagers 21 have been described as having modulating, scanning beams. It will be understood that other techniques may be employed to control the laser beams to cause the beams to create an image corresponding to the data provided via the print spooler on the lithographic plates. Also, it will be understood that software or hardware techniques other than the print spooler 300 and interface cards 302 may be used to feed the data to the laser imagers.

It will also be understood that devices other than the linear motor 203 may be used to move the laser transport carriage 25 and that devices other than pneumatic cylinders may be used to move and/or position the carriage and plates. It is also understood that devices other than vacuum grippers may be used to engage the plates.

Although the apparatus has been described as a combination of various off the shelf items, it is contemplated that the apparatus may be a single integrated system with all functions being controlled by a central computer. Also, it is contemplated that the PLC may be incorporated in or replaced by a computer or may be part of the computer system.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. Apparatus for exposing lithographic plates without the use of film, said apparatus comprising:

a flat support for supporting a first plate and a separate second plate at an exposure station, a conveyor system for conveying the first and second plates to the exposure station and depositing the plates on the support, a first laser imager mounted at the exposure station above the support for generating a first laser beam adapted to sweep over the first plate along a first path, a second laser imager mounted at the exposure station above the support for generating a second laser beam adapted to sweep over the second plate along a second path, said first and second paths being generally parallel to one another, and the sweep of the second laser beam over the second plate being independent of the sweep of the first laser beam over the first plate, a mechanism for effecting simultaneous relative movement between the first laser imager and the first plate and between the second laser imager and the second plate in a direction generally perpendicular to said first and second paths swept by said laser beams, said laser imagers remaining in fixed positions relative to one another during said relative movement, said first and second plates remaining in fixed position relative to one another during said relative movement, a computer system for receiving source image data corresponding to first and second source images, said first and second source images corresponding to first and second print images to be formed on said first and second plates, respectively, said computer system being operable for generating a first set of electrical signals corresponding to the first source image and providing said signals to the first laser imager, and for generating a second set of electrical signals corresponding to the second source image and providing said signals to the second laser imager, said first and second laser imagers being responsive to said first and second sets of electrical signals to modulate said first and second laser beams, respectively, said laser beams sweeping simultaneously over the first and second plates, respectively, in synchronization with said relative movement between the laser imagers and the plates whereby the first laser beam is adapted to expose certain portions of the first plate to the first beam to form said first print image on the first plate and said second laser beam is adapted to expose certain portions of the second plate to the second beam to form said second print image on the second plate.

2. Apparatus for exposing lithographic plates without the use of film, said apparatus comprising:

a flat support for supporting a first plate and a separate second plate at an exposure station, a conveyor system for conveying the first and second plates to the exposure station and depositing the plates on the support, a first laser imager mounted at the exposure station above the support for generating a first laser beam adapted to sweep over the first plate along a first path, a second laser imager mounted at the exposure station above the support for generating a second laser beam adapted to sweep over the second plate along a second path, said first and second paths being generally parallel to one another, and the sweep of the second laser beam over the second plate being independent of the sweep of the first laser beam over the first plate, a mechanism for effecting simultaneous relative movement between the first laser imager and the first plate and between the second laser imager and the second plate in a direction generally perpendicular to said first and second paths swept by said laser beams, said laser imagers remaining in fixed positions relative to one another during said relative movement, a computer system for receiving source image data corresponding to first and second source images, said first and second source images corresponding to first and second print images to be formed on said first and second plates, respectively, said computer system being operable for generating a first set of electrical signals corresponding to the first source image and providing said signals to the first laser imager, and for generating a second set of electrical signals corresponding to the second source image and providing said signals to the second laser imager, said first and second laser imagers being responsive to said first and second sets of electrical signals to modulate said first and second laser beams, respectively, said laser beams sweeping simultaneously over the first and second plates, respectively, in synchronization with said relative movement between the laser imagers and the plates whereby the first laser beam is adapted to expose certain portions of the first plate to the first beam to form said first print image on the first plate and said second laser beam is adapted to expose certain portions of the second plate to the second beam to form said second print image on the second plate, wherein each of the first and second laser imagers is mounted at the exposure station above the support by an adjustment device providing independent vertical adjustment of the imager relative to the support so that the elevation of the first laser imager above the first plate may be adjusted independently of the elevation of the second laser imager above the second plate.

3. The apparatus of claim 2 wherein the support is stationary and said mechanism for effecting said simultaneous relative movement comprises a carriage mounted above the support for reciprocating movement relative to the support, said first and second laser imagers being mounted on the carriage.

4. The apparatus of claim 3 wherein said first and second plates are adapted to be positioned side-by-side on the support, and wherein said carriage is mounted for reciprocating movement over both side-by-side plates simultaneously so that said first laser beam sweeps over the first plate as the second laser beam sweeps over the second plate.

5. The apparatus of claim 4 wherein the carriage is mounted for linear reciprocating movement on a pair of parallel tracks at opposite sides of the apparatus.

6. The apparatus of claim 3 further comprising a shield extending down from the carriage at a location between the first and second laser imagers, said shield being operable to reduce interference between the first and second laser beams.

7. The apparatus of claim 3 wherein the computer system comprises a raster image processor for receiving the source image data corresponding to the first and second source images and converting the data into the first and second sets of electrical signals, and a buffer for storing the first and second sets of electrical signals.

8. The apparatus of claim 7 further comprising a controller and a position detector for detecting the position of the carriage relative to the plates on the support and providing to the controller a position signal indicating the position of the carriage relative to the plate or plates, said controller being responsive to position signals received from said position detector to generate said first and second sets of electrical signals.

9. The apparatus of claim 8 wherein the controller is operable to sequentially transfer the first set of electrical signals to the first laser imager in response to said position signals as the first laser sweeps over the first plate, and wherein the controller is operable to sequentially transfer the second set of electrical signals to the second laser imager in response to the position signal as the second laser imager sweeps over the second plate.

10. The apparatus of claim 8 wherein the buffer comprises a print spooler.

11. The apparatus of claim 8 further comprising a linear motor for moving the carriage relative to the support, and wherein the position signal comprises a motor position signal indicating a position of the linear motor, said motor position signal being provided to the controller to indicate the position of the first and second laser imagers relative to the support as the laser imagers on the carriage reciprocate relative to the support.

12. The apparatus of claim 7 wherein the buffer includes a first interface card for receiving the first set of electrical signals and providing the first set of electrical signals to the first laser imager and a second interface card for receiving the second set of electrical signals and providing the second set of electrical signals to the second laser imager.

13. A method of exposing lithographic plates without the use of film, said method comprising the steps of:

A) providing source image data corresponding to first and second source images, said first and second source images corresponding to first and second print images to be formed on first and second plates maintained in fixed position relative to each other, B) generating a first set of electrical signals corresponding to the first source image, C) generating a second set of electrical signals corresponding to the second source image, D) generating a first laser beam by a first laser imager, said first laser beam corresponding to the first set of electrical signals and sweeping across the first plate, E) generating a second laser beam by a second laser imager maintained in fixed position relative to the first laser imager, said second laser beam corresponding to the second set of electrical signals and sweeping simultaneously and independently of the first laser beam across the second plate, and F) performing steps D and E simultaneously while maintaining the first and second laser imagers in fixed position relative to each other and while maintaining the first and second plates in fixed position relative to each other whereby said first laser beam exposes certain portions of the first plate to form said first print image on the first plate simultaneously as said second laser beam exposes certain portions of the second plate to form said second print image on the second plate.

14. The method of claim 13 further comprising positioning said first and second plates on a support, operating first and second laser imagers to generate respective first and second laser beams, and, while the laser beams are sweeping paths over the plates, moving the laser imagers in a direction generally perpendicular to the paths.

15. Apparatus for exposing lithographic plates without the use of film, said apparatus comprising:

means for providing source image data corresponding to first and second source images, said first and second source images corresponding to first and second print images to be formed on first and second plates maintained in fixed position relative to each other, means for generating a first set of electrical signals corresponding to the first source image, means for generating a second set of electrical signals corresponding to the second source image, first beam generating means for generating a first laser beam corresponding to the first set of electrical signals, said first beam generating means being operable to sweep the first laser beam across the first plate, and second beam generating means maintained in fixed position relative to the first beam generating means, for generating a second laser beam, said second laser beam corresponding to the second set of electrical signals, said second beam generating means being operable to sweep the second laser beam simultaneously and independently of the first laser beam across the second plate, said first and second beam generating means being maintained in fixed position relative to each other and said first and second plates being maintained in fixed position relative to each other as said first and second laser beams sweep across respective plates whereby said first laser beam exposes certain portions of the first plate to form said first print image on the first plate simultaneously as said second laser beam exposes certain portions of the second plate to form said second print image on the second plate.

16. The apparatus of claim 15 further comprising means for positioning said first and second plates on a support, wherein the first and second beam generating means comprise first and second laser imagers generating the first and second laser beams, respectively, and further comprising means for moving the laser imagers in a direction generally perpendicular to paths the laser beams are sweeping over the plates.

* * * * *